(12) United States Patent
Ikeuchi et al.

(10) Patent No.: US 11,856,365 B2
(45) Date of Patent: Dec. 26, 2023

(54) TRANSDUCER INCLUDING COUPLER FITTED IN SLITS BETWEEN BEAMS

(71) Applicant: Murata Manufacturing Co., Ltd., Nagaokakyo (JP)

(72) Inventors: Shinsuke Ikeuchi, Nagaokakyo (JP); Seiji Umezawa, Nagaokakyo (JP); Masayuki Suzuki, Nagaokakyo (JP); Fumiya Kurokawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/830,501

(22) Filed: Jun. 2, 2022

(65) Prior Publication Data

US 2022/0303693 A1 Sep. 22, 2022

Related U.S. Application Data

(63) Continuation of application No. PCT/JP2020/031101, filed on Aug. 18, 2020.

(30) Foreign Application Priority Data

Dec. 17, 2019 (JP) .................................. 2019-227180

(51) Int. Cl.
*H04R 17/02* (2006.01)
*H10N 30/853* (2023.01)

(52) U.S. Cl.
CPC .......... *H04R 17/02* (2013.01); *H04R 2400/01* (2013.01); *H10N 30/8542* (2023.02)

(58) Field of Classification Search
CPC ...... H04R 17/02; H04R 17/00; H04R 17/005; H04R 17/025; H04R 2400/01;
(Continued)

(56) References Cited

U.S. PATENT DOCUMENTS 8,529,021 B2 * 9/2013 Baumer ............... B41J 2/03
347/65
8,733,176 B2 * 5/2014 Li .................... B81B 3/0086
73/715

(Continued)

FOREIGN PATENT DOCUMENTS

DE 102010009453 A1 9/2011
EP 2362686 A2 8/2011
(Continued)

OTHER PUBLICATIONS

International Search Report in PCT/JP2020/031101, dated Oct. 6, 2020, 3 pages.
(Continued)

*Primary Examiner* — Ahmad F. Matar
*Assistant Examiner* — Sabrina Diaz
(74) *Attorney, Agent, or Firm* — Keating & Bennett, LLP

(57) ABSTRACT

A transducer includes a base, beams, and a coupler. The beams each include a piezoelectric layer, a first electrode layer, and a second electrode layer. The coupler is fitted in slits between adjacent beams to define a connection between the beams. The coupler extends from an upper portion of the base into each of the slits without a break. A Young's modulus of the material of the coupler is lower than a Young's modulus of the material of the piezoelectric layer. A maximum thickness of the coupler in the upper portion of the base in the direction of the central axis of the base is greater than a thickness of each of the beams.

20 Claims, 10 Drawing Sheets

(58) Field of Classification Search
CPC .. H04R 2499/11; H04R 9/06; H04R 2217/00; H04R 2217/01; H04R 2217/03; H10N 30/8542; H10N 30/10513; H10N 30/20; H10N 30/2023; H10N 30/2027; H10N 30/2041; H10N 30/2047; H10N 30/30; H10N 30/302; H10N 30/304; H10N 30/308
USPC .................... 381/334, 87, 332, 91, 173, 190
See application file for complete search history.

(56) References Cited

U.S. PATENT DOCUMENTS

| | | | | |
|---|---|---|---|---|
| 9,029,963 | B2* | 5/2015 | Sparks | H04R 17/02 257/416 |
| 9,497,556 | B2 | 11/2016 | Kaltenbacher et al. | |
| 10,293,377 | B2 | 5/2019 | Guedes et al. | |
| 10,710,874 | B2* | 7/2020 | Frischmuth | G01L 1/00 |
| 11,212,623 | B2* | 12/2021 | Duan | H04R 7/18 |
| 2012/0250909 | A1* | 10/2012 | Grosh | H04R 31/003 381/174 |
| 2015/0162523 | A1* | 6/2015 | Umeda | H04R 17/025 310/331 |
| 2021/0051414 | A1* | 2/2021 | Duan | H04R 17/02 |

FOREIGN PATENT DOCUMENTS

| | | |
|---|---|---|
| EP | 3201122 A1 | 8/2017 |
| JP | S59144997 U | 9/1984 |
| JP | S61150499 A | 7/1986 |
| WO | 2016054447 A1 | 4/2016 |

OTHER PUBLICATIONS

Written Opinion in PCT/JP2020/031101, dated Oct. 6, 2020, 3 pages.

* cited by examiner

TRANSDUCER INCLUDING COUPLER FITTED IN SLITS BETWEEN BEAMS

CROSS REFERENCE TO RELATED APPLICATIONS

This application claims the benefit of priority to Japanese Patent Application No. 2019-227180 filed on Dec. 17, 2019 and is a Continuation Application of PCT Application No. PCT/JP2020/031101 filed on Aug. 18, 2020. The entire contents of each application are hereby incorporated herein by reference.

BACKGROUND OF THE INVENTION

1. Field of the Invention

The present invention relates to a transducer and, more specifically, to an acoustic transducer that can be used as a transmitter capable of transmitting acoustic waves and as an acoustic wave receiver (microphone) capable of receiving acoustic waves. The present invention is particularly directed to an ultrasonic transceiver capable of transmitting and receiving ultrasonic waves.

2. Description of the Related Art

A configuration of such a transducer is disclosed in Japanese Unexamined Patent Application Publication No. 61-150499. The transducer disclosed in Japanese Unexamined Patent Application Publication No. 61-150499 is in the form of a divided piezoelectric diaphragm. The divided piezoelectric diaphragm includes a piezoelectric diaphragm. An electrode sheet is attached to a surface of the piezoelectric diaphragm. The piezoelectric diaphragm includes sheet metal and a thin piezoelectric ceramic plate bonded to a surface of the sheet metal or two thin piezoelectric ceramic plates bonded to the respective surfaces of the sheet metal. The peripheral portion of the piezoelectric diaphragm is a left-out portion. The piezoelectric ceramic plate except for the let-out portion includes narrow grooves extending radially and filled with insulating viscoelastic resin.

The insulating viscoelastic resin can come off of the narrow grooves due to vibration of the diaphragm, in which case the device characteristics of the transducer disclosed in Japanese Unexamined Patent Application Publication No. 61-150499 will degrade.

SUMMARY OF THE INVENTION

Preferred embodiments of the present invention provide transducers in each of which a coupler fitted in slits between adjacent beams is stably fixed in place to improve device characteristics.

A transducer according to a preferred embodiment of the present invention includes a base, beams, and a coupler. The base is ring-shaped. The beams each include a fixed end portion and a tip portion. The fixed end portion is connected to an inner periphery of the base. The tip portion is located opposite to the fixed end portion. Each of the beams extends in such that the tip portion is farther than the fixed end portion from the inner periphery. The beams each include a piezoelectric layer, a first electrode layer, and a second electrode layer. The first electrode layer and the second electrode layer are on opposite sides of the piezoelectric layer in a direction of a central axis of the base such that the second electrode layer faces at least a portion of the first electrode layer with the piezoelectric layer interposed therebetween. The coupler is fitted in slits between adjacent ones of the beams to define a connection between the beams. The coupler extends from an upper portion of the base into each of the slits without a break. The Young's modulus of the material of the coupler is lower than the Young's modulus of the material of the piezoelectric layer. The maximum thickness of the coupler in the upper portion of the base in the direction of the central axis of the base is greater than the thickness of each of the beams.

The coupler fitted in slits between adjacent ones of the beams is stably fixed in place to improve device characteristics of each of preferred embodiments of the present invention.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
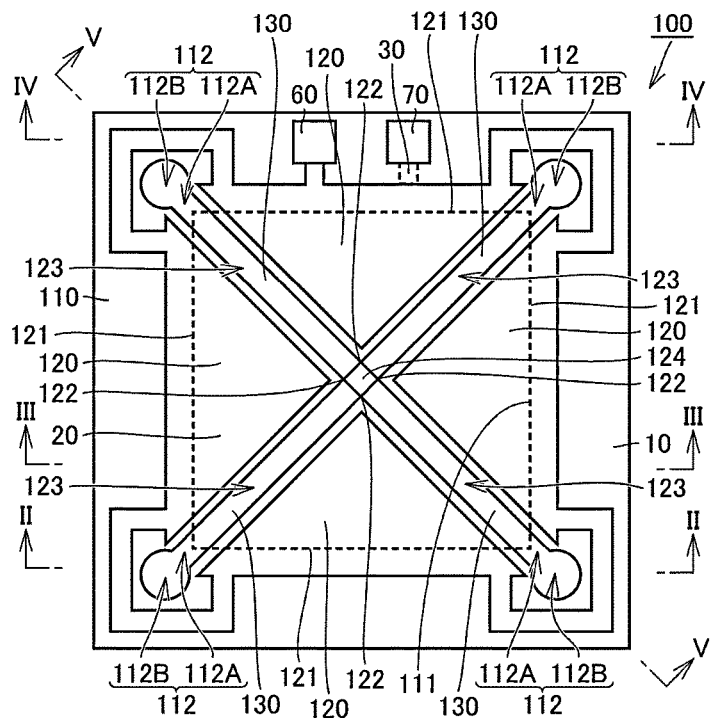
FIG. 1 is a plan view of a transducer according to Preferred Embodiment 1 of the present invention.

Hereinafter, transducers according to preferred embodiments of the present invention will be described with reference to the accompanying drawings. In the following description of the preferred embodiments, the same or corresponding portions in the drawings are denoted by the same reference characters, and redundant description thereof will be omitted.

Preferred Embodiment 1

Figure 2:
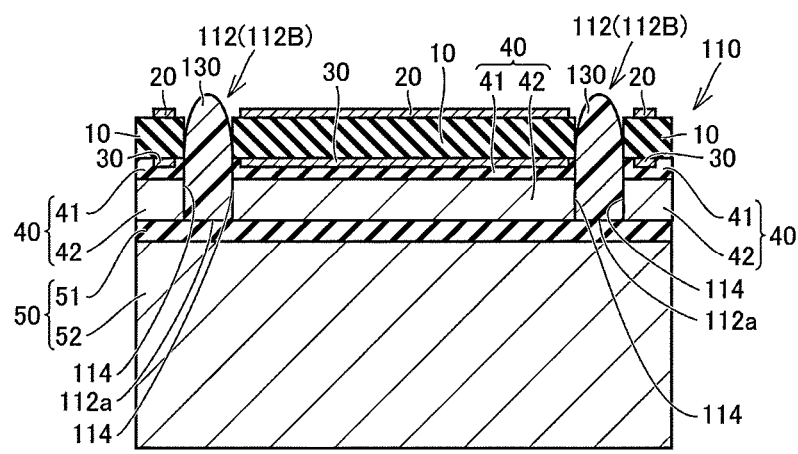
FIG. 2 is a sectional view of the transducer taken along line II-II in FIG. 1, illustrating the transducer viewed in the direction of arrows.
Figure 3:
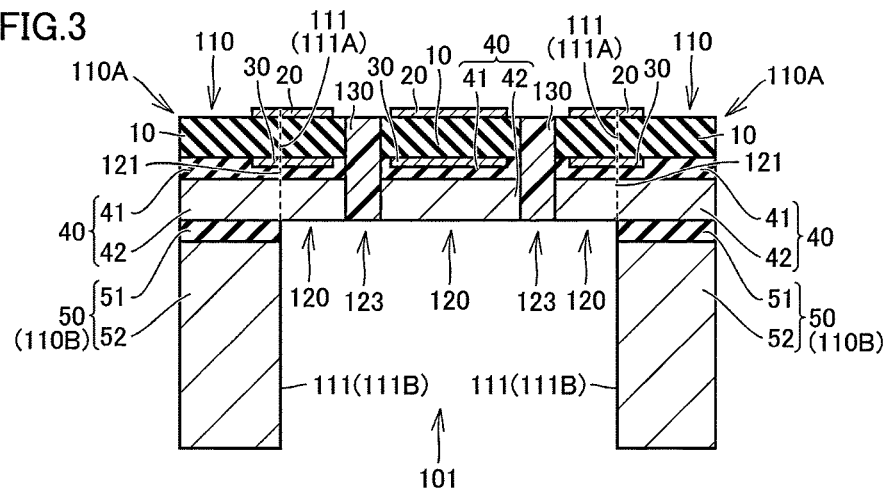
FIG. 3 is a sectional view of the transducer taken along line in FIG. 1, illustrating the transducer viewed in the direction of arrows.
Figure 4:
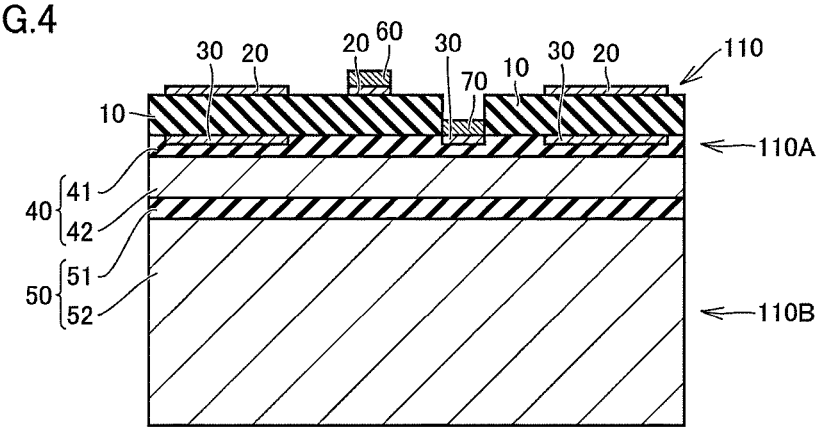
FIG. 4 is a sectional view of the transducer taken along line IV-IV in FIG. 1, illustrating the transducer viewed in the direction of arrows.
Figure 5:
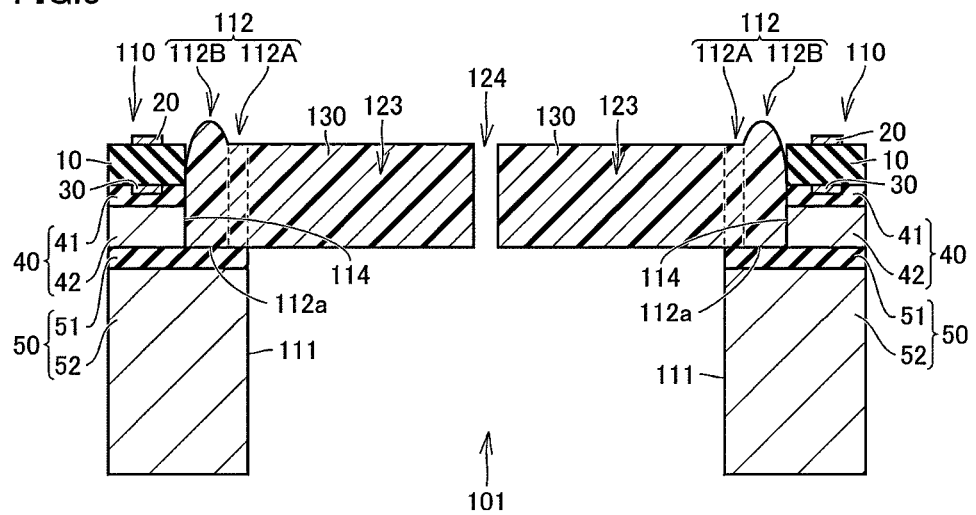
FIG. 5 is a sectional view of the transducer taken along line V-V in FIG. 1, illustrating the transducer viewed in the direction of arrows.

FIG. 1 is a plan view of a transducer according to Preferred Embodiment 1 of the present invention. FIG. 2 is a sectional view of the transducer taken along line II-II in FIG. 1, illustrating the transducer viewed in the direction of arrows. FIG. 3 is a sectional view of the transducer taken along line III-III in FIG. 1, illustrating the transducer viewed in the direction of arrows. FIG. 4 is a sectional view of the transducer taken along line IV-IV in FIG. 1, illustrating the transducer viewed in the direction of arrows. FIG. 5 is a sectional view of the transducer taken along line V-V in FIG. 1, illustrating the transducer viewed in the direction of arrows.

Referring to FIGS. 1 to 5, the transducer according to Preferred Embodiment 1 of the present invention is denoted by 100 and includes a base 110, beams 120, and a coupling member 130. The beams 120 are capable of bending and vibrating, and the transducer 100 according to the present preferred embodiment can be used as an ultrasonic transducer.

The base 110 is, for example, ring-shaped as illustrated in FIGS. 1 to 5. An upper portion of the base 110 includes recesses 112. Portions of the base 110 and the recesses 112 will be described later in detail. The upper portion of the base 110 is closer than the other portion of the base 110 to one side in the direction of the central axis (axial direction) of the ring-shaped base 110 and is not limited to a portion closest to the one side in the axial direction. The upper portion of the base 110 is not limited to an upper portion of any one of the members of the base 110.

Referring to FIG. 3, the base 110 in the present preferred embodiment includes an upper base 110A and a lower base 110B. The upper base 110A and the lower base 110B are located on opposite sides in the direction of the central axis of the base 110 that is ring-shaped. An inner periphery 111 of the base 110 extends such that there is no break between an inner periphery 111A of the upper base 110A and an inner periphery 111B of the lower base 110B except in the recesses 112 (see FIGS. 1 and 2). More specifically, the inner periphery 111A of the upper base 110A and the inner periphery 111B of the lower base 110B in the present preferred embodiment coincide with each other except in the recesses 112 when viewed in the axial direction. In some preferred embodiments, at least a portion of the inner periphery 111B of the lower base 110B is closer than the inner periphery 111A of the upper base 110A to the inner side (the central axis) when viewed in the axial direction. For example, a region being a portion of the inner periphery 111B of the lower base 110B and being adjacent to the upper base 110A coincides with the inner periphery 111A of the upper base 110A, except in the recesses 112 when viewed in the axial direction, and a region being a portion of the inner periphery 111B of the lower base 110B and located opposite the upper base 110A is closer than the inner periphery 111A of the upper base 110A to the inner side (the central axis) when viewed in the axial direction.

Referring to FIGS. 1 and 3, the beams 120 each include a fixed end portion 121 and a tip portion 122. The fixed end portion 121 is connected to the inner periphery 111 of the base 110. More specifically, the fixed end portion 121 is connected to only the inner periphery 111A of the upper base 110A, not to the inner periphery of the lower base 110B. The fixed end portions 121 in the present preferred embodiment are located in the same or substantially the same plane orthogonal or substantially orthogonal to the central axis of the base 110. The tip portions 122 are located opposite the respective fixed end portions 121. Each of the beams 120 extends such that the tip portion 122 is farther than the fixed end portion 121 from the inner periphery 111. The beams 120 in the present preferred embodiment are located in the above-described plane in a state in which the transducer 100 is not in operation.

As illustrated in FIG. 1, the outer shape of each beam 120 in the present preferred embodiment tapers in the direction in which the beam 120 extends (the direction of extension of the beam 120) when viewed in the direction of the central axis. More specifically, each beam 120 has a triangular or substantially triangular outer shape when viewed in the direction of the central axis. In the present preferred embodiment, the triangular or substantially triangular shape refers to an isosceles triangle, where the base is the fixed end portion 121, and the apex is located in the tip portion 122. That is, each beam 120 extends along a line passing through the midpoint of the base and the apex of the isosceles triangle that is the outer shape of the beam 120. With a view to promoting bending and vibration, the length of each beam 120 in the present preferred embodiment, that is, the dimension in the direction of extension of the beam 120 is preferably greater than or equal to about five times the thickness of the beam 120 in the direction of the central axis.

Referring to FIG. 1, the transducer 100 in the present preferred embodiment includes four beams 120, for example. The tip portions 122 of the beams 120 point to the central axis of the base 110 when viewed in the direction of the central axis of the base 110. More specifically, the beams 120 are arranged symmetrically or substantially symmetrically about an imaginary center of the transducer 100 when viewed in the direction of the central axis. When viewed in the direction of the central axis, the four beams 120 in the present preferred embodiment are located in the same or substantially the same plane orthogonal or substantially orthogonal to the central axis and extend in different directions, with each beam 120 extending at an angle of about 90° from the direction of extension of the beam 120 adjacent thereto.

The beams 120 in the present preferred embodiment include slits 123, each of which is located between adjacent ones of the beams 120. The slits 123 are connected to each other in a region close to the tip portions 122 of the beams 120.

Each slit 123 is preferably as narrow as possible. For example, the width of each slit 123 is preferably less than or equal to about 10 μm and is more preferably less than or equal to about 1 μm.

Referring to FIGS. 1 to 5, each of the beams 120 includes a piezoelectric layer 10, a first electrode layer 20, and a second electrode layer 30.

The piezoelectric layer 10 is made of a single crystal, for example. Selecting an appropriate cut orientation of the piezoelectric layer 10 enables the transducer to have desired device characteristics. The piezoelectric layer 10 in the present preferred embodiment is obtained by slimming down a single-crystal substrate, such as a rotated Y-cut substrate. The rotated Y-cut substrate has, for example, a cut-angle of about 30°. The thickness of the piezoelectric layer 10 may, for example, be more than or equal to about 0.3 μm and less than or equal to about 5.0 μm.

Selecting an appropriate material of the piezoelectric layer 10 enables the transducer 100 to have desired device characteristics. The piezoelectric layer 10 in the present preferred embodiment is made of an inorganic material. More specifically, the piezoelectric layer 10 is made of, for example, an alkali niobate compound or an alkali tantalate compound. In the present preferred embodiment, alkali metal included in the alkali niobate compound or alkali metal included in the alkali tantalate compound is, for example, at least one of lithium, sodium, or potassium. The piezoelectric layer 10 in the present preferred embodiment is made of lithium niobate ($LiNbO_3$) or lithium tantalate ($LiTaO_3$), for example.

As illustrated in FIG. 3, the first electrode layer 20 and the second electrode layer 30 are disposed on opposite sides of the piezoelectric layer 10 in the direction of the central axis of the base 110. The second electrode layer 30 of each beam 120 faces at least a portion of the first electrode layer 20 with the piezoelectric layer 10 interposed therebetween in the axial direction. The piezoelectric layer 10 in the present preferred embodiment is overlaid with adhesive layers (not illustrated). One of the adhesive layers is disposed between the first electrode layer 20 and the piezoelectric layer 10, and the other adhesive layer is disposed between the second electrode layer 30 and the piezoelectric layer 10.

The first electrode layer 20 and the second electrode layer 30 in the present preferred embodiment are each made of Pt, for example. In some preferred embodiments, the first electrode layer 20 and the second electrode layer 30 are each made of, for example, A1. The adhesive layers in the present preferred embodiment are each made of Ti, for example. In some preferred embodiments, the adhesive layers are each made of, for example, NiCr. The first electrode layer 20, the second electrode layer 30, and the adhesive layers each may be an epitaxially grown film. In the case where the piezoelectric layer 10 is made of lithium niobate ($LiNbO_3$), the piezoelectric layer 10 is preferably overlaid with adhesive layers made of NiCr, for example, with a view to eliminating or reducing the possibility that the material of the adhesive layers will diffuse into the first electrode layer 20 or the second electrode layer 30. The transducer 100 has added reliability accordingly.

The thickness of the first electrode layer 20 and the thickness of the second electrode layer 30 in the present preferred embodiment each may, for example, be more than or equal to about 0.05 μm and less than or equal to about 0.2 μm. The thickness of each of the adhesive layers may, for example, be more than or equal to about 0.005 μm and less than or equal to about 0.05 μm.

The beams 120 each include, in addition to these layers, a support layer 40. The support layer 40 is disposed on a surface of the piezoelectric layer 10 and a surface of the second electrode layer 30 so as to be located opposite the first electrode layer 20 and opposite the piezoelectric layer 10. The support layer 40 includes a first supporter 41 and a second supporter 42. The second supporter 42 is located opposite the piezoelectric layer 10 with the first supporter 41 interposed therebetween. In the present preferred embodiment, the first supporter 41 is made of $SiO_2$, and the second supporter 42 is made of single-crystal Si, for example. The support layer 40 in the present preferred embodiment is preferably thicker than the piezoelectric layer 10 in view of bending and vibration of the beams 120. The mechanism by which the beams 120 bend and vibrate will be described later.

The following describes the members of the base 110. Referring to FIG. 4, the base 110 is analogous to the beams 120 in the following respect: the base 110 includes a piezoelectric layer 10, a first electrode layer 20, a second electrode layer 30, and a support layer 40. The base 110 includes, in addition to these layers, a substrate layer 50, a first connection electrode layer 60, and a second connection electrode layer 70. In the present preferred embodiment, the piezoelectric layer 10, the first electrode layer 20, the second electrode layer 30, the support layer 40, the first connection electrode layer 60, and the second connection electrode layer 70 are included in the upper base 110A, and the substrate layer 50 is included in the lower base 110B.

The substrate layer 50 and the support layer 40 are connected to each other such that the substrate layer 50 is located opposite the piezoelectric layer 10 with the support layer 40 interposed therebetween in the direction of the central axis. The substrate layer 50 includes a first substrate layer 51 and a second substrate layer 52, which are arranged in a stack. The second substrate layer 52 is located opposite the support layer 40 with the first substrate layer 51 interposed therebetween in the direction of the central axis. In the present preferred embodiment, the first substrate layer 51 is a region being a portion of the lower base 110B and being adjacent to the upper base 110A, and the second substrate layer 52 is a region being a portion of the lower base 110B and being located opposite the upper base 110A. In the present preferred embodiment, for example, the first substrate layer 51 is made of $SiO_2$, and the second substrate layer 52 is made of single-crystal Si.

As illustrated in FIG. 4, the first connection electrode layer 60 is electrically connected to the first electrode layer 20 with an adhesive layer (not illustrated) interposed therebetween and is exposed to view from outside. More specifically, the first connection electrode layer 60 in the base 110 is located opposite the piezoelectric layer 10 with the first electrode layer 20 interposed therebetween.

The second connection electrode layer 70 is electrically connected to the second electrode layer 30 with an adhesive layer (not illustrated) interposed therebetween and is exposed to view from outside. More specifically, the second connection electrode layer 70 in the base 110 is located opposite the support layer 40 with the second electrode layer 30 interposed therebetween.

The thickness of the first connection electrode layer 60 and the thickness of the second connection electrode layer 70 each may, for example, be more than or equal to about 0.1 µm and less than or equal to about 1.0 µm. The thickness of the adhesive layer connected to the first connection electrode layer 60 and the thickness of the adhesive layer connected to the second connection electrode layer 70 each may, for example, be more than or equal to about 0.005 µm and less than or equal to about 0.1 µm.

The first connection electrode layer 60 and the second connection electrode layer 70 in the present preferred embodiment are each made of, for example, Au. In some preferred embodiments, the first connection electrode layer 60 and the second connection electrode layer 70 are each made of a conductive material, such as, for example, Al. In the present preferred embodiment, the adhesive layer connected to the first connection electrode layer and the adhesive layer connected to the second connection electrode layer 70 each may, for example, be made of Ti. In some preferred embodiments, the adhesive layers are each made of, for example, NiCr.

In the present preferred embodiment, each of the layers (the piezoelectric layer 10, the first electrode layer 20, the second electrode layer 30, and the support layer 40) of the base 110 and the corresponding one of the layers (the piezoelectric layer 10, the first electrode layer 20, the second electrode layer 30, and the support layer 40) of each beam 120 extend without a break along an imaginary plane orthogonal or substantially orthogonal to the central axis of the base 110. More specifically, each of the layers (the piezoelectric layer 10, the first electrode layer 20, the second electrode layer 30, and the support layer 40) of the upper base 110A and the corresponding one of the layers (the piezoelectric layer 10, the first electrode layer 20, the second electrode layer 30, and the support layer 40) of each beam 120 extend without a break.

The transducer 100 according to the present preferred embodiment includes a cavity 101, where an opening is located opposite the piezoelectric layer 10 in the direction of the central axis. The cavity 101 is a space defined by the base 110, the beams 120, and the slits 123. More specifically, the cavity 101 in the present preferred embodiment is a space defined by the lower base 110B, the beams 120, and the slits 123. As illustrated in FIG. 3, the cavity 101 in the present preferred embodiment is provided such that the upper base 110A is partitioned off from the lower base 110B. As illustrated in FIGS. 1 and 3, the slits 123 are provided such that the beams 120 are partitioned off from the upper base 110A, with the fixed end portions 121 being defined. The fixed end portions 121 are located along the inner periphery 111A of the upper base 110A.

The recesses 112 in the upper portion of the base 110 will be described below in detail. As illustrated in FIGS. 1 to 3 and FIG. 5, each of the recesses 112 is connected to a corresponding one of the slits 123. The maximum width of each of the recesses 112 viewed in the direction of the central axis of the base 110 is greater than the width of the corresponding one of the slits 123, where the maximum width of each of the recesses 112 is the dimension orthogonal or substantially orthogonal to the direction in which the corresponding one of the slits 123 extends. For example, the maximum width of each recess 112 viewed in the axial direction is more than or equal to about 50 µm and less than or equal to about 200 µm.

More specifically, the recesses 112 in the present preferred embodiment each include an inner recess 112A and an outer recess 112B. The outer recess 112B is located opposite the slit 123 with the inner recess 112A interposed therebetween and is connected to the inner recess 112A. The width of each of the inner recesses 112A viewed in the direction of the central axis is equal or substantially equal to the width of the corresponding one of the slits 123, where the width of each of the inner recess 112A is the dimension orthogonal or substantially orthogonal to the direction in which the corresponding one of the slits 123 extends. The maximum width of each of the outer recesses 112B viewed in the direction of the central axis is greater than the width of the corresponding one of the slits 123, where the maximum width of each of the outer recesses 112B is the dimension orthogonal or substantially orthogonal to the direction in which the corresponding one of the slits 123 extends.

Each outer recess 112B has a circular or substantially circular outer shape when viewed in the direction of the central axis. For example, the inside diameter of each outer recess 112B viewed in the axial direction is more than or equal to about 50 µm and less than or equal to about 200 µm.

As illustrated in FIG. 5, the recesses 112 in the present preferred embodiment are formed by cutting out the piezoelectric layer 10 and a portion of the support layer 40 such that the recesses 112 extend from the inner periphery 111 of the base 110 toward the outer periphery of the base 110. That is, the recesses 112 in the present preferred embodiment are provided in the base 110 so as to be on the side on which the piezoelectric layer 10 is located. The recesses 112 each include a bottom surface 112a, which is a surface of the substrate layer 50 and is located on the support layer 40.

In some preferred embodiments, the recesses 112 are formed by cutting out the piezoelectric layer 10, the first supporter 41, and a portion of the second supporter 42 closer than the other portion of the second supporter 42 to the first supporter 41 such that the recesses 112 extend from the inner periphery 111 of the base 110 toward the outer periphery of the base 110. In this case, the bottom surfaces 112a of the recesses 112 each may be a surface of a step formed by cutting out a portion of the second supporter 42. Alternatively, the recesses 112 may be formed by cutting out the piezoelectric layer 10 and the first supporter 41 such that the recesses 112 extend from the inner periphery 111 of the base 110 toward the outer periphery of the base 110. In this case, each of the bottom surfaces 112a of the recesses 112 is a surface of the second supporter 42 and is located on the first supporter 41. Still alternatively, the recesses 112 may be formed by cutting out the piezoelectric layer 10 and one portion of the first supporter 41 closer than the other portion of the first supporter 41 to the piezoelectric layer 10 such that the recesses 112 extend from the inner periphery 111 of the base 110 toward the outer periphery of the base 110. In this case, the bottom surfaces 112a of the recesses 112 each may be a surface of a step formed by cutting out part of the first supporter 41.

Still alternatively, the recesses 112 may be formed by cutting out the piezoelectric layer 10, the support layer 40, and one part of the substrate layer 50 closer than the other portion of the substrate layer 50 to the support layer 40 such that the recesses 112 extend from the inner periphery 111 of the base 110 toward the outer periphery of the base 110. In this case, the bottom surfaces 112a of the recesses 112 each may be a surface of a step formed by cutting out a portion of the substrate layer 50.

As illustrated in FIGS. 1 and 3, the coupling member 130 is fitted in the slits 123 between adjacent ones of the beams 120 to provide a connection between the beams 120 such that the beams 120 are capable of undergoing displacement along the central axis, with the fixed end portions 121 being anchored.

As described above, each slit 123 between adjacent ones of the beams 120 is preferably as narrow as possible. This eliminates or reduces the possibility that a portion of the coupling member 130 in the slits 123 will come off and will fall into the cavity 101 during the process of forming the coupling member 130 in the slits 123. Thus, a connection between the beams 120 can be easily formed by the coupling member 130.

The coupling member 130 in the slits 123 may extend off the edges of the slits 123 so as to overlap the beams 120 located adjacent to each other when viewed in the direction of the central axis. The area of the overlap between the coupling member 130 and each beam 120 viewed in the direction of the central axis is preferably as small as possible due to the need to reduce weight variation between the beams 120. For example, the coupling member 130 is preferably not in contact with the first electrode layer 20 of each beam 120 when viewed in the direction of the central axis.

As illustrated in FIG. 1, the slits 123 in the present embodiment each include a portion in which the coupling member 130 is not located when viewed in the direction of the central axis. More specifically, the coupling member 130 is not disposed in a central clearance 124, in which the slits 123 meet. That is, the tip portions 122 of the beams 120 in the present preferred embodiment are not connected to each other by the coupling member 130 and are discretely located away from each other. As illustrated in FIG. 5, the central clearance 124 is connected to the cavity 101.

The minimum width of the central clearance 124 in the present preferred embodiment is preferably greater than the width of the slits 123 when the central clearance 124 is viewed in the direction of the central axis. The central clearance 124 being of such a width is advantageous in terms of ease of providing a space in which the beams 120 are not connected to each other by the coupling member 130 and are discretely located away from each other.

Figure 6:
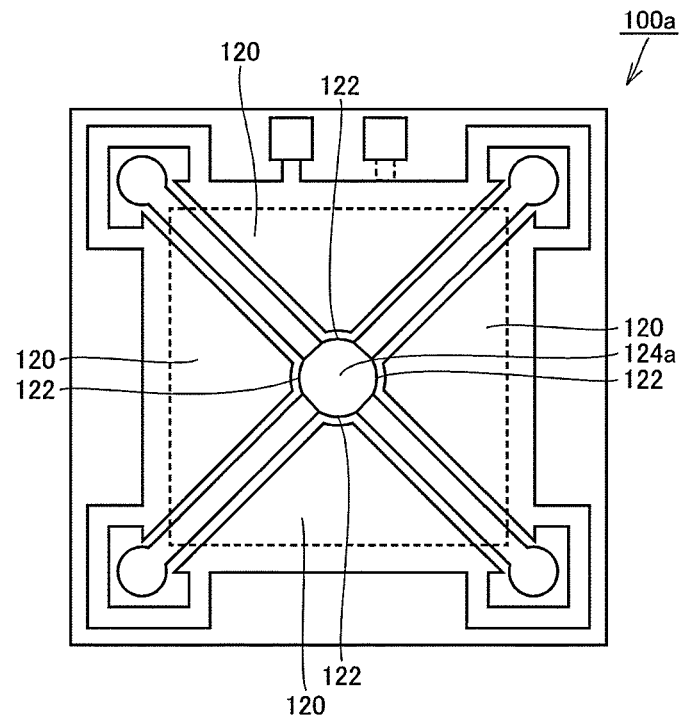
FIG. 6 is a plan view of a transducer according to a first modification of Preferred Embodiment 1 of the present invention.

The tip portions 122 of the beams 120 in the present preferred embodiment may be cut out to enlarge the central clearance 124. FIG. 6 is a plan view of a transducer according to a first modification of Preferred Embodiment 1 of the present invention. Referring to FIG. 6, the transducer according to the first modification of Preferred Embodiment 1 of the present invention is denoted by 100a, and the beams 120 each have a trapezoidal or substantially trapezoidal outer shape. In this modification, the minimum width of the central clearance 124 viewed in the direction of the central axis may, for example, be more than or equal to about 10 μm and less than or equal to about 30 μm.

In the present preferred embodiment, the thickness of the coupling member 130 fitted in the slits 123 viewed in the direction of the central axis (the dimension of the coupling member 130 in the axial direction) is equal or substantially equal to the thickness of each beam 120 (the dimension of each beam in the axial direction) as illustrated in FIG. 3. Alternatively, the thickness of the coupling member 130 fitted in the slits 123 (the dimension of the coupling member 130 in the axial direction) may be greater than the thickness of each of the beams 120. However, the thickness of the coupling member 130 fitted in the slits 123 viewed in the direction of the central axis (the dimension of the coupling member 130 in the axial direction) is preferably as small as possible in view of the need to facilitate the vibration of the beams 120. On the other hand, the thickness of the coupling member 130 (the dimension of the coupling member 130 in the axial direction) is preferably greater than or equal to about two times the depth of the slits 123 in the axial direction, that is, greater than or equal to about two times the thickness of each beam 120 in light of the need to suppress vibration of the beams 120 in the coupled vibration mode.

As illustrated in FIGS. 1 and 5, the coupling member 130 fitted in the upper portion of the base 110 and each slit 123 without a break. Specifically, the coupling member 130 is fitted inside each of the recesses 112 and the corresponding one of the slits 123 without a break. More specifically, the coupling member 130 is fitted inside the outer recess 112B, the inner recess 112A, and the slit 123 without a break along an imaginary plane orthogonal to the central axis.

The maximum thickness of the coupling member 130 on the bottom surface 112a of each of the recesses 112 defined by side walls 114 is greater than the height of each of the side walls 114, where the maximum thickness of the coupling member 130 is the dimension in the direction of the central axis of the base 110. The maximum thickness of the coupling member 130 in the upper portion of the base 110 in the direction of the central axis of the base 110 is greater than the thickness of each of the beams 120. The portion being a portion of the coupling member 130 and having the maximum thickness in the direction of the central axis is located on the bottom surface 112a of the outer recess 112B. The portion being a portion of the coupling member 130 and located on the bottom surface 112a of the outer recess 112B has a curved surface located opposite the bottom surface 112a and protruding outward.

The Young's modulus of the material of the coupling member 130 is lower than the Young's modulus of the material of the piezoelectric layer 10. For example, the Young's modulus of the material of the coupling member 130 is preferably lower than or equal to about 1 GPa. The Young's modulus of the material of the coupling member 130 is more preferably lower than or equal to about 100 Mpa, for example. The Young's modulus of the material of the coupling member 130 is preferably higher than or equal to about 0.1 Mpa, for example. The source of the values regarded as the Young's modulus of the material of the piezoelectric layer 10 and the Young's modulus of the material of the coupling member 130 may be any known database in which physical properties of materials are compiled. Alternatively, the Young's modulus of the material of the piezoelectric layer 10 and the Young's modulus of the material of the coupling member 130 may be determined by calculation using the rate of deformation measured by nanoindentation, in which pressure is applied to samples taken from the piezoelectric layer 10 and the coupling member 130 of the transducer 100. The coupling member 130 in the present preferred embodiment is preferably made of a material that has relatively high heat resistance to withstand reflow soldering.

The coupling member 130 is made of an organic material. In terms of the Young's modulus, for example, silicone resin or fluoroelastomer is preferred as the material of the coupling member 130 in a preferred embodiment of the present invention. Under low temperature conditions, the Young's modulus of silicone resin is lower than the Young's modulus of fluoroelastomer. For this reason, the coupling member 130 is preferably made of silicone resin, for example. The use of silicone resin as the material of the coupling member 130 enables the transducer 100 to operate in a relatively wide temperature range. For example, polyimide resin and parylene (a polymer of para-xylylene) are rigid resins each having a relatively high Young's modulus in excess of about 1 GPa. Thus, whether polyimide resin or parylene can be used as the material of the coupling member 130 depends on the Young's modulus of the material of the piezoelectric layer 10.

Figure 7:
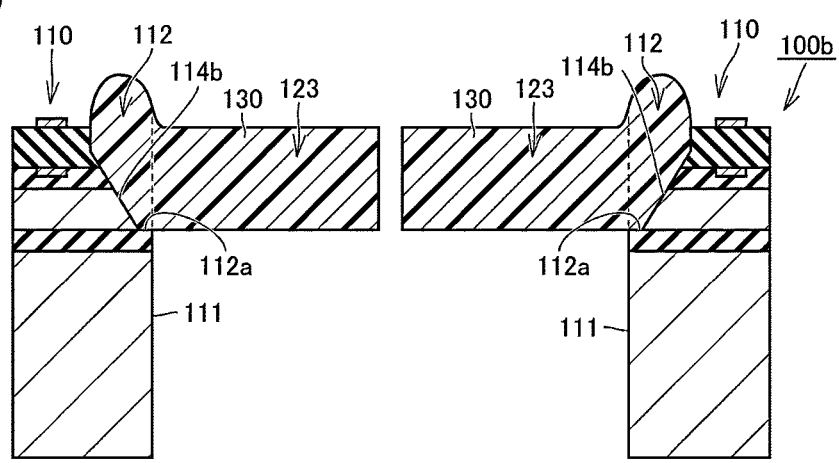
FIG. 7 is a sectional view of a transducer according to a second modification of Preferred Embodiment 1 of the present invention.

The side wall 114 of each recess 112 in the present preferred embodiment extends in the direction of the central axis. In some preferred embodiments, the side wall 114 of each recess 112 defines an angle with the direction of the central axis. FIG. 7 is a sectional view of a transducer according to a second modification of Preferred Embodiment 1 of the present invention. FIG. 7 is a sectional view analogous to FIG. 5. Referring to FIG. 7, the transducer according to the second modification of Preferred Embodiment 1 of the present invention is denoted by 100b, and the side wall of each recess 112 is denoted by 114b. A portion of each side wall 114b is inclined toward the inner periphery 111 of the base 110 while extending from the upper portion of the base 110 to the bottom surface 112a. In this modification, the maximum thickness of the coupling member 130 in the upper portion of the base 110 in the direction of the central axis of the base 110 is greater than the thickness of each of the beams 120. The coupling member 130, in this modification, is fitted inside each of the recesses 112 and the corresponding one of the slits 123 without a break.

Figure 8:
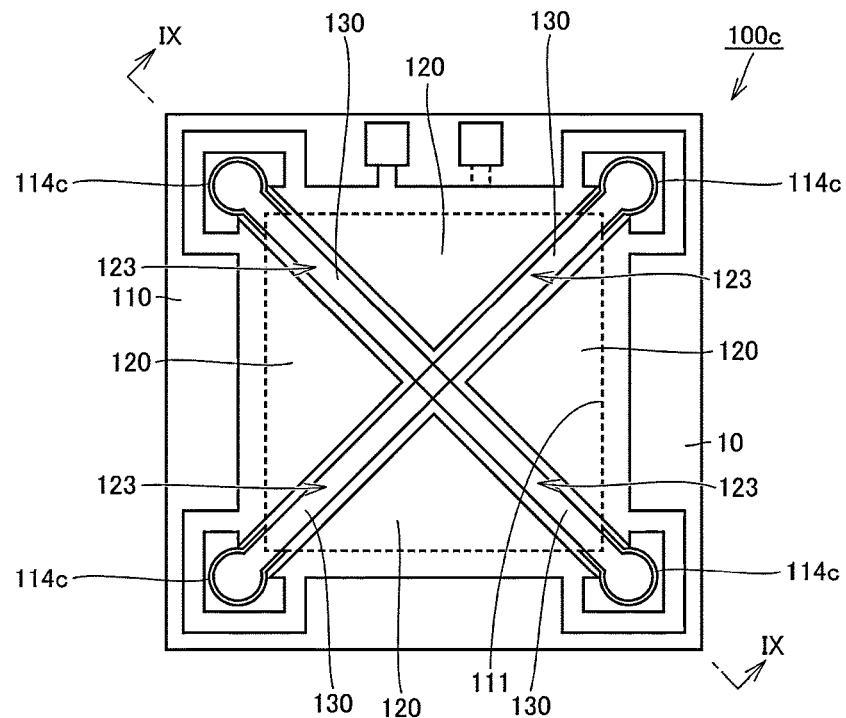
FIG. 8 is a plan view of a transducer according to a third modification of Preferred Embodiment 1 of the present invention.
Figure 9:
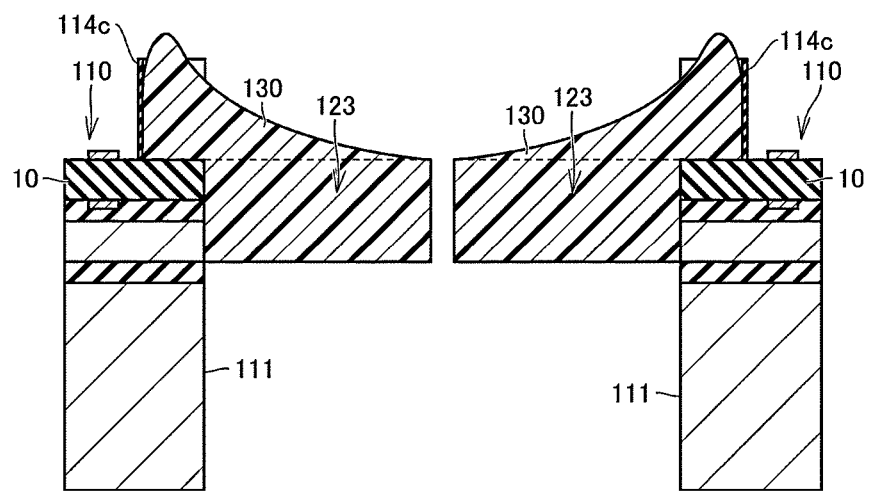
FIG. 9 is a sectional view of the transducer taken along line IX-IX in FIG. 8, illustrating the transducer viewed in the direction of arrows.

In a case where the maximum thickness of the coupling member 130 in the upper portion of the base 110 is greater than the thickness of each of the beams 120, it is not required that the recesses 112 be provided in the base 110 in the present preferred embodiment. FIG. 8 is a plan view of a transducer according to a third modification of Preferred Embodiment 1 of the present invention. FIG. 9 is a sectional view of the transducer taken along line IX-IX in FIG. 8, illustrating the transducer viewed in the direction of arrows. Referring to FIGS. 8 and 9, the transducer according to the third modification of Preferred Embodiment 1 of the present invention is denoted by 100c and does not include the recesses that are cut in the base 110 so as to extend from the inner periphery 111 of the base 110 toward the outer periphery of the base 110. The base 110 in this modification is provided with walls 114c, which are closer to the piezoelectric layer 10 than to the rest of the base 110 in the direction of the central axis.

The walls 114c extend out from the piezoelectric layer 10 of the base 110 in the axial direction. The walls 114c are in contact with the coupling member 130 on the base 110 when viewed in the axial direction. Each of the walls 114c overlaps the corresponding one of the slits 123 when viewed in the axial direction. The coupling member 130, in this modification, extends from the upper portion of the base 110 into each of slits 123 without a break.

Each of the beams 120 of the transducer 100 in the present preferred embodiment is capable of bending and vibrating. The following describes the mechanism by which the beams 120 bend and vibrate.

Figure 10:
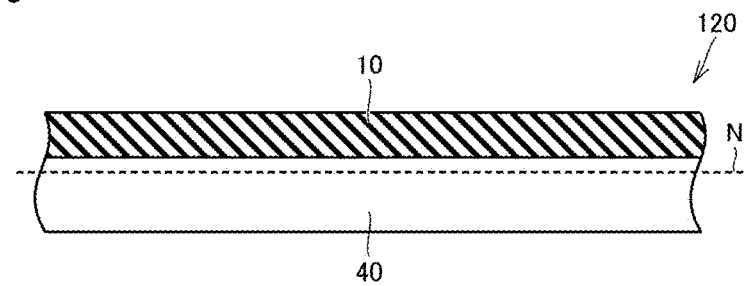
FIG. 10 is a sectional view of one of beams of the transducer according to Preferred Embodiment 1 of the present invention, schematically illustrating a portion of the beam.
Figure 11:
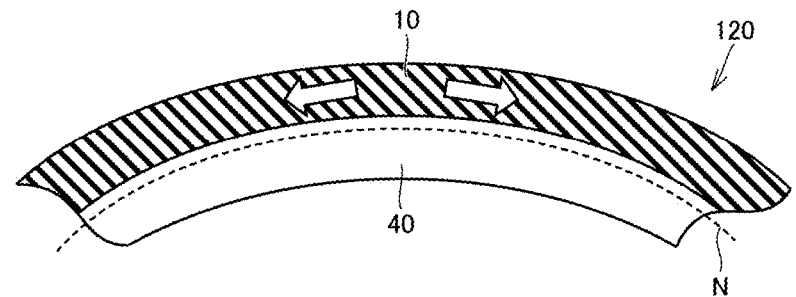
FIG. 11 is a sectional view of one of the beams of the transducer according to Preferred Embodiment 1 of the present invention, schematically illustrating a portion of the beam of the transducer in operation.

FIG. 10 is a sectional view of one of the beams of the transducer according to Preferred Embodiment 1 of the present invention, schematically illustrating a portion of the beam. FIG. 11 is a sectional view of one of the beams of the transducer according to Preferred Embodiment 1 of the present invention, schematically illustrating a portion of the beam of the transducer in operation. The first electrode layer and the second electrode layer are not illustrated in FIGS. 10 and 11.

As illustrated in FIGS. 10 and 11, the beams 120 in the present preferred embodiment each include an extendable layer and a constraining layer. In the present preferred embodiment, the piezoelectric layer 10 is the extendable layer that extends and contracts in a planar direction orthogonal or substantially orthogonal to the central axis, and the support layer 40 is the main portion of the constraining layer. The constraining layer is stacked on the extendable layer in a direction orthogonal or substantially orthogonal to the direction in which the extendable layer extends and contracts. In place of the constraining layer, an oppositely extendable layer may be included in each beam 120. When the extendable layer extends in the planar direction, the oppositely extendable layer can contract in the planar direction. When the extendable layer contracts in the planar direction, the oppositely extendable layer can extend in the planar direction.

When the piezoelectric layer 10 defining and functioning as the extendable layer starts extending or contracting in the planar direction, the support layer 40 that is the main portion of the constraining layer constrains extension and contraction of the piezoelectric layer 10 at an interface between the support layer 40 and the piezoelectric layer 10. The beams 120 in the present preferred embodiment each include the piezoelectric layer 10 being the extendable layer and the support layer 40 being the main portion of the constraining layer. The piezoelectric layer 10 of each beam 120 is located on only one side of a stress neutral plane N in the beam 120. The barycenter of the support layer 40 of each beam 120 is located on the other side of the stress neutral plane N of the beam 120. As illustrated in FIGS. 10 and 11, the beams 120 bend in the direction orthogonal or substantially orthogonal to the planar direction when the respective piezoelectric layers 10 acting as extendable layers extend and contract in the planar direction. The amount of displacement of each beam 120 at the time of bending increases in proportion to the distance between the stress neutral plane N and the piezoelectric layer 10. The amount of displacement increases with increasing stress caused by extension and contraction of the piezoelectric layer 10. The beams 120 bend and vibrate in the direction orthogonal or substantially orthogonal to the planar direction, with the fixed end portions 121 being anchored.

Figure 12:
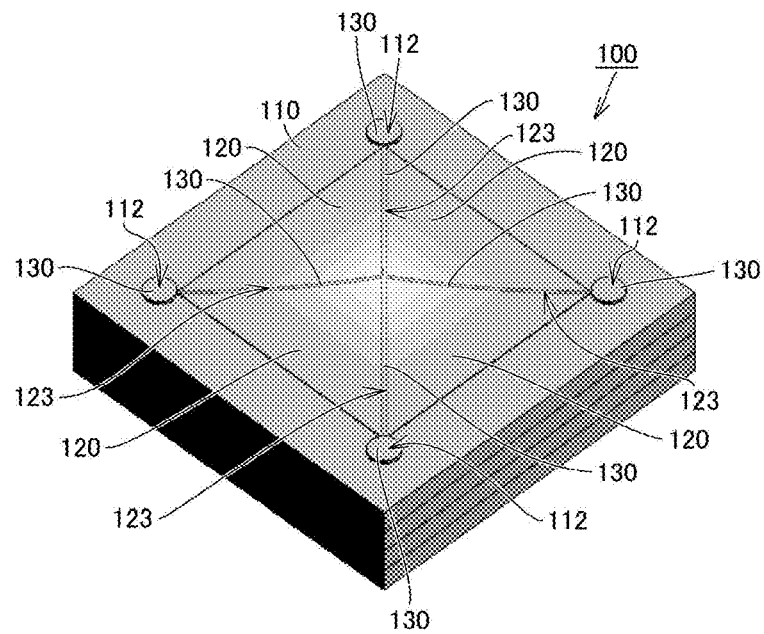
FIG. 12 is a perspective view of the transducer according to Preferred Embodiment 1 of the present invention, illustrating a state in which the transducer vibrates in the fundamental vibration mode in simulation.

The transducer 100 according to the present preferred embodiment is prone to generate vibration in the fundamental vibration mode where the occurrence of vibration in the coupled vibration mode is reduced by the coupling member 130. FIG. 12 is a perspective view of the transducer according to Preferred Embodiment 1 of the present invention, illustrating a state in which the transducer vibrates in the fundamental vibration mode in simulation. More specifically, FIG. 12 illustrates a state in which the beams 120 of the transducer 100 undergo displacement directed to the respective first electrode layers 20. Lightly shaded areas of the beams 120 in FIG. 12 denote areas that undergo a larger amount of displacement directed to the respective first electrode layers 20. The first electrode layers 20 are not illustrated in FIG. 12.

As illustrated in FIG. 12, all of the beams 120 are in phase and entirely or substantially entirely undergo displacement upward or downward at the same or substantially the same time when bending and vibrating in the fundamental vibration mode.

At least one beam 120 is out of phase with the other beams 120 when bending and vibrating in the coupled vibration mode. As illustrated in FIG. 12, the beams 120 in the present preferred embodiment are connected to each other by the coupling member 130 in the slits 123 such that the occurrence of vibration in the coupled vibration mode is reduced. The Young's modulus of the material of the coupling member 130 is lower than the Young's modulus of the material of the piezoelectric layer 10. Thus, the coupling member 130 defines a connection between the beams 120 so as to reduce the occurrence of coupled vibration and ensures that the beams 120 are easily become deformed. Thus, bending and vibration of the beams 120 in the fundamental vibration mode are less inhibited by the coupling member 130 of the transducer 100, in which the fundamental vibration mode takes precedence over the coupled vibration mode accordingly.

In the present preferred embodiment, the maximum thickness of the coupling member 130 in the upper portion of the base 110 is relatively great such that the coupling member 130 is firmly fixed to the base 110 due to the friction between the base 110 and the coupling member 130 on the upper portion of the base 110. Thus, the coupling member 130 inside the slits 123 is fixed stably by the base 110 in the face of vibration of the beams 120. The coupling member 130 in the present preferred embodiment is fitted inside each of the recesses 112 and the corresponding one of the slits 123 without a break such that the coupling member 130 is firmly fixed to the base 110 due to the friction between the coupling member 130 in each recess 112 and the inner surface of the recess 112. Thus, the coupling member 130 inside the slits 123 is fixed stably by the base 110 in spite of vibration of the beams 120.

The transducer 100 according to the present preferred embodiment is prone to generate vibration in the fundamental vibration mode, whereas the occurrence of vibration in the coupled vibration mode is reduced. For this reason, the transducer 100 can exhibit improved device characteristics when being used as an ultrasonic transducer. The functions of the transducer 100 according to the present preferred embodiment for the case in which the transducer 100 is used as an ultrasonic transducer will be described below.

The following describes how the transducer 100 generates ultrasound. First, a voltage is applied between the first connection electrode layer 60 and the second connection electrode layer 70 (see FIG. 1). This is followed by application of voltage between the first electrode layer 20 connected to the first connection electrode layer 60 and the second electrode layer 30 connected to the second connection electrode layer 70 (see FIG. 4). Similarly, each beam 120 is subjected to application of voltage between the first electrode layer 20 and the second electrode layer 30 facing each other with the piezoelectric layer interposed therebetween (see FIG. 3). The application of voltage causes the piezoelectric layer 10 to extend and contract along a plane orthogonal or substantially orthogonal to the central axis, and as a result, the mechanism functions such that the beams 120 each bend and vibrate in the direction of the central axis. Consequently, a force is exerted on a medium around the beams 120 of the transducer 100 and causes the medium to vibrate so as to generate ultrasound.

The beams 120 of the transducer 100 according to the present preferred embodiment have natural mechanical resonant frequencies. In a case where a sinusoidal voltage is applied with a frequency close to the resonant frequencies of the beams 120, bending of the beams 120 involves a large amount of displacement of the beams 120.

The following describes how the transducer 100 detects ultrasound. Ultrasound can cause a medium around the beams 120 to vibrate such that the medium exerts a force on the beams 120, and as a result, the beams 120 each bend and vibrate. When each beam 120 bends and vibrates, stress is exerted on the piezoelectric layer 10. The stress exerted on the piezoelectric layer 10 induces an electrical charge in the piezoelectric layer 10. The electrical charge induced in the piezoelectric layer 10 creates a potential difference between the first electrode layer 20 and the second electrode layer 30 facing each other with the piezoelectric layer 10 therebetween. The potential difference is then detected by the first connection electrode layer 60 connected to the first electrode layer 20 and by the second connection electrode layer 70 connected to the second electrode layer 30. In this way, the transducer 100 detects ultrasound.

In a case where components of a certain frequency close to the resonant frequencies are dominant in ultrasound to be detected, bending of the beams 120 involves a large amount of displacement of the beams 120. An increase in the amount of displacement translates into an increase in the potential difference.

Thus, optimization of resonant frequencies of the beams 120 is an important factor in using the transducer 100 according to the present preferred embodiment as an ultrasonic transducer. The resonant frequency of each beam 120 is dependent on its dimension in the direction of extension, its thickness in the direction of the central axis, the length of each fixed end portion 121 viewed in the axial direction, and the density and the elastic modulus of the material of the beam 120. The beams preferably have the same or substantially the same resonant frequency. In a case where the beams 120 have different thicknesses, the dimension in the direction of extension of each beam 120 may be adjusted such that the beams 120 have the same or substantially the same resonant frequency.

For example, the beams 120 of the transducer 100 illustrated in FIGS. 1 to 5 as Preferred Embodiment 1 of the present invention each have a resonant frequency of about 40 kHz when each beam 120 is within the following specifications: (i) the material of the piezoelectric layer 10: lithium niobate; (ii) the thickness of the piezoelectric layer

10: about 1 μm; (iii) the thickness of the first electrode layer 20: about 0.1 μm; (iv) the thickness of the second electrode layer 30: about 0.1 μm; (v) the thickness of the first supporter 41: about 0.8 μm; (vi) the thickness of the second supporter 42: about 1.4 μm; (vii) the shortest distance between the fixed end portion 121 and the tip portion 122 of each beam 120: about 400 μm; and (viii) the length of the fixed end portion 121 of each beam 120 viewed in the direction of the central axis: about 800 μm.

As described above, the transducer 100 according to the present preferred embodiment is prone to generate vibration in the fundamental vibration mode, whereas the occurrence of vibration in the coupled vibration mode is reduced by the coupling member 130 that is fitted in the slits 123 and stably fixed by the base 110. This eliminates or reduces the possibility that the beams 120 of the transducer 100 used as an ultrasonic transducer will vibrate out of phase with each other at the time of detection of ultrasound that has frequency components corresponding to the resonant frequency of the beams 120. Unless the beams 120 vibrate out of phase with each other, electrical charges generated in the piezoelectric layers 10 of the beams 120 will be prevented from cancelling each other out in the first electrode layers 20 or the second electrode layers 30.

Thus, the transducer 100 can exhibit improved device characteristics when being used as an ultrasonic transducer.

Figure 13:
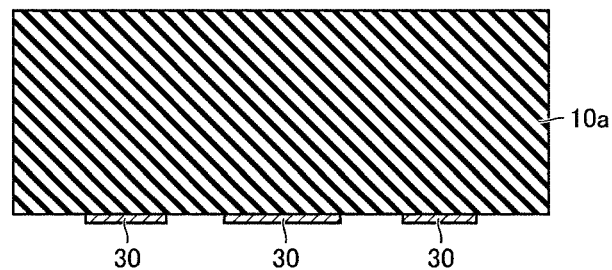
FIG. 13 is a sectional view of work in process under a non-limiting example of a method for manufacturing the transducer according to Preferred Embodiment 1 of the present invention, illustrating a state in which a second electrode layer is formed on a piezoelectric single-crystal substrate.

The following describes a non-limiting example of a method for manufacturing the transducer 100 according to Preferred Embodiment 1 of the present invention. FIG. 13 is a sectional view of work in process under the method for manufacturing the transducer according to Preferred Embodiment 1 of the present invention, illustrating a state in which a second electrode layer is formed on a piezoelectric single-crystal substrate. FIGS. 13 to 18 and FIG. 20 are sectional views analogous to FIG. 3. FIGS. 14 to 18 and FIG. 20 will be mentioned later.

An adhesive layer (not illustrated) is formed on a lower surface of a piezoelectric single-crystal substrate 10a, and the second electrode layer 30 is then formed such that the piezoelectric single-crystal substrate 10a and the second electrode layer 30 are located on opposite sides with the adhesive layer interposed therebetween (see FIG. 13). The second electrode layer 30 is formed into a desired pattern by, for example, vapor deposition lift-off processing. In some preferred embodiments, the second electrode layer 30 is formed by the following process: a layer is formed over all or substantially all of the lower surface of the piezoelectric single-crystal substrate 10a by for example, sputtering and is then formed into a desired pattern by etching. The second electrode layer 30 and the adhesive layer may be grown epitaxially.

Figure 14:
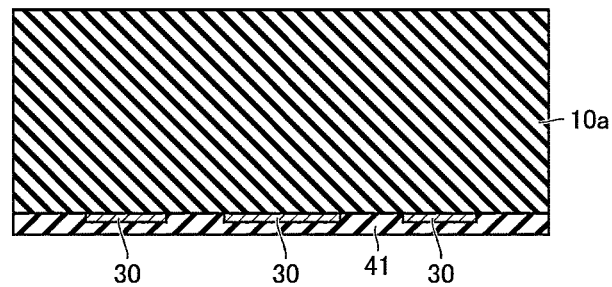
FIG. 14 is a sectional view of work in process under the non-limiting example of a method for manufacturing the transducer according to Preferred Embodiment 1 of the present invention, illustrating a state in which a first supporter is formed.

FIG. 14 is a sectional view of work in process under the method for manufacturing the transducer according to Preferred Embodiment 1 of the present invention, illustrating a state in which a first supporter is formed. The first supporter 41 is formed on the lower surface of the piezoelectric single-crystal substrate 10a and the lower surface of the second electrode layer 30 by, for example, chemical vapor deposition (CVD) or physical vapor deposition (PVD) (see FIG. 14). Without additional processing applied to the first supporter 41, the lower surface of the first supporter 41 includes bulges located opposite the second electrode layer 30. The lower surface of the first supporter 41 is then flattened by, for example, chemical mechanical polishing (CMP).

Figure 15:
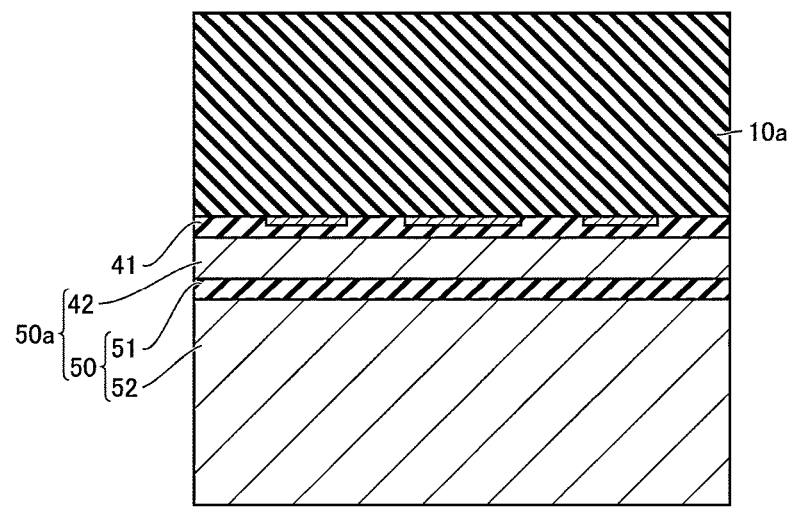
FIG. 15 is a sectional view of work in process under the non-limiting example of a method for manufacturing the transducer according to Preferred Embodiment 1 of the present invention, illustrating a state in which a multilayer body is bonded to the first supporter.

FIG. 15 is a sectional view of work in process under the method for manufacturing the transducer according to Preferred Embodiment 1 of the present invention, illustrating a state in which a multilayer body is bonded to the first supporter. A multilayer body 50a includes the second supporter 42 and the substrate layer 50 and is bonded to the lower surface of the first supporter 41 by, for example, surface activated bonding or atomic diffusion bonding (see FIG. 15). The multilayer body 50a in the present preferred embodiment is, for example, a silicon-on-insulator (SOI) substrate. An upper surface of the second supporter 42 may be flattened by, for example, CMP prior to the bonding process such that the transducer 100 can be manufactured with improved yield.

Figure 16:
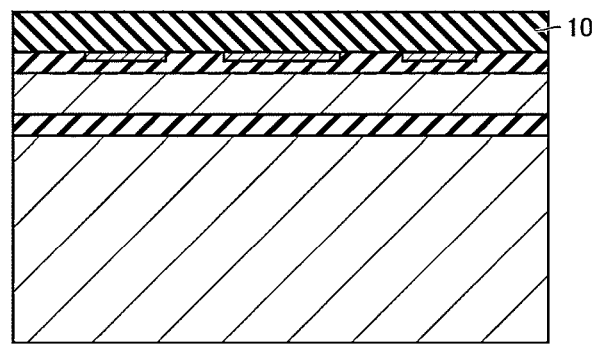
FIG. 16 is a sectional view of work in process under the non-limiting example of a method for manufacturing the transducer according to Preferred Embodiment 1 of the present invention, illustrating a state in which a piezoelectric layer formed by grinding the piezoelectric single-crystal substrate.

FIG. 16 is a sectional view of work in process under the method for manufacturing the transducer according to Preferred Embodiment 1 of the present invention, illustrating a state in which a piezoelectric layer formed by, for example, grinding the piezoelectric single-crystal substrate. An upper surface of the piezoelectric single-crystal substrate 10a is ground using, for example, a grinder to reduce the thickness of the piezoelectric single-crystal substrate 10a (see FIGS. 15 and 16). After the thickness of the piezoelectric single-crystal substrate 10a is reduced, the upper surface of the piezoelectric single-crystal substrate 10a is polished by, for example, CMP. In this way, the piezoelectric single-crystal substrate 10a is formed into the piezoelectric layer 10.

In some preferred embodiments, a release layer is formed by, for example, implantation of ions into the upper surface of the piezoelectric single-crystal substrate 10a and is then removed. In this way, the piezoelectric single-crystal substrate 10a is formed into the piezoelectric layer 10. After the removal of the release layer, the upper surface of the piezoelectric single-crystal substrate 10a may be polished by, for example, CMP to form the piezoelectric single-crystal substrate 10a into the piezoelectric layer 10.

Figure 17:
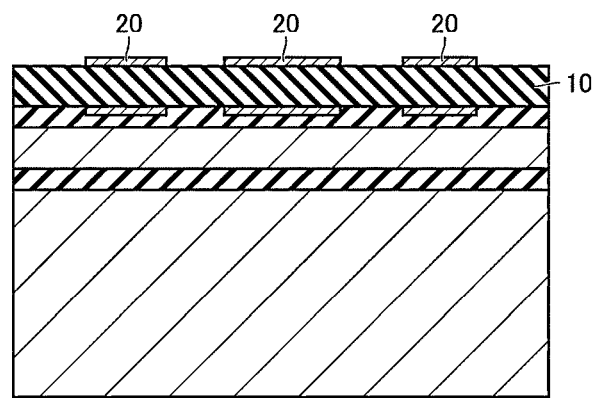
FIG. 17 is a sectional view of work in process under the non-limiting example of a method for manufacturing the transducer according to Preferred Embodiment 1 of the present invention, illustrating a state in which a first electrode layer is formed on the piezoelectric layer.

FIG. 17 is a sectional view of work in process under the method for manufacturing the transducer according to Preferred Embodiment 1 of the present invention, illustrating a state in which a first electrode layer is formed on the piezoelectric layer. An adhesive layer (not illustrated) is formed on the upper surface of the piezoelectric layer 10, and the first electrode layer 20 is then formed such that the piezoelectric layer 10 and the first electrode layer 20 are located on opposite sides with the adhesive layer interposed therebetween (see FIG. 17). The first electrode layer 20 is formed into a desired pattern by, for example, vapor deposition lift-off processing. In some preferred embodiments, the first electrode layer 20 is formed by the following process: a layer is formed over all or substantially all of the upper surface of the piezoelectric layer 10 by sputtering and is then formed into a desired pattern by etching. The first electrode layer 20 and the adhesive layer may be grown epitaxially.

Figure 18:
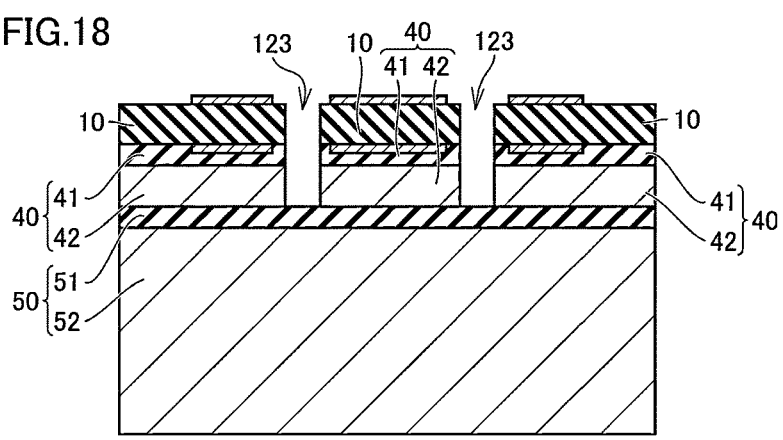
FIG. 18 is a sectional view of work in process under the non-limiting example of a method for manufacturing the transducer according to Preferred Embodiment 1 of the present invention, illustrating a state in which slits extend from a surface of the piezoelectric layer opposite the supporter to an upper surface of the substrate layer.
Figure 19:
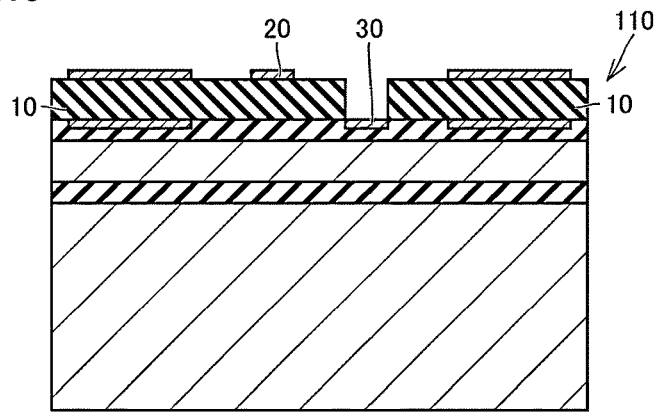
FIG. 19 is a sectional view of work in process under the non-limiting example of a method for manufacturing the transducer according to Preferred Embodiment 1 of the present invention, illustrating a state in which a through-hole extends from the surface of the piezoelectric layer opposite the supporter to an upper surface of the second electrode layer.

FIG. 18 is a sectional view of work in process under the method for manufacturing the transducer according to Preferred Embodiment 1 of the present invention, illustrating a state in which slits extend from a surface of the piezoelectric layer opposite the supporter to an upper surface of the substrate layer. FIG. 19 is a sectional view of work in process under the method for manufacturing the transducer according to Preferred Embodiment 1 of the present invention, illustrating a state in which a through-hole extends from the surface of the piezoelectric layer opposite the supporter to an upper surface of the second electrode layer. FIG. 19 is a sectional view analogous to FIG. 4.

Slits extending through both the piezoelectric layer 10 and the first supporter 41 are formed by dry etching, such as reactive ion etching (RIE) (see FIG. 18), for example. In some preferred embodiments, the slits are formed by wet etching using, for example, a mixture of hydrofluoric acid (HF) and nitric acid (HNO$_3$). Regions being a portion of the second supporter 42 and exposed through the slits is subjected to deep reactive ion etching (DRIE) such that the slits extend to the upper surface of the substrate layer 50. In this way, the slits 123 are formed. When the slits 123 are formed, a portion of the base 110 is subjected to the dry etching or the wet etching and is then removed by DRIE such that the slits 123 and the recesses 112 (see FIGS. 1, 2, and 5) are formed at the same time. The piezoelectric layer 10 in the base 110 is subjected to the dry etching or the wet etching such that the second electrode layer 30 is partially exposed (see FIG. 19).

The base 110 is then subjected to the following process (see FIG. 4): adhesive layers (not illustrated) are formed on the first electrode layer 20 and the second electrode layer 30, and the first connection electrode layer 60 and the second connection electrode layer 70 are formed on upper surfaces of the adhesive layers by vapor deposition lift-off processing. In some preferred embodiments, the first connection electrode layer 60 and the second connection electrode layer 70 are formed by the following process: a layer is formed over all or substantially all of the piezoelectric layer 10, the first electrode layer 20, and exposed regions of the second electrode layer 30 by sputtering and is then formed into a desired pattern by etching.

Figure 20:
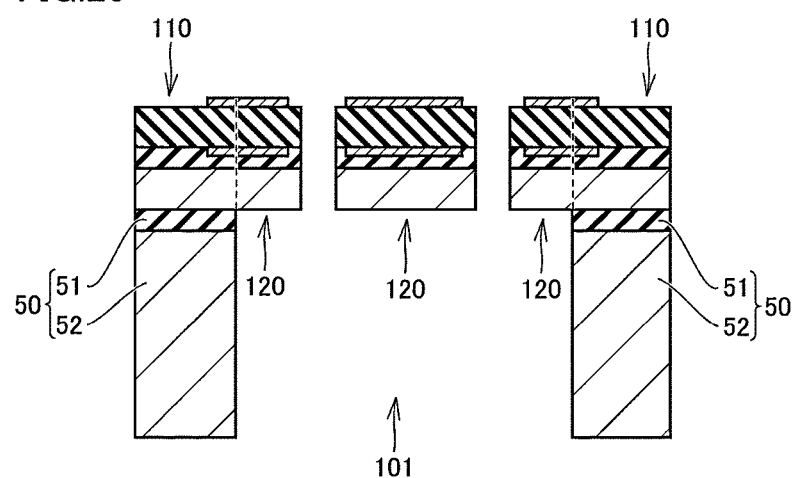
FIG. 20 is a sectional view of work in process under the non-limiting example of a method for manufacturing the transducer according to Preferred Embodiment 1 of the present invention, illustrating a state in which a cavity is formed.

FIG. 20 is a sectional view of work in process under the method for manufacturing the transducer according to Preferred Embodiment 1 of the present invention, illustrating a state in which a cavity is formed. The second substrate layer 52 included in the substrate layer 50 is partially removed by DRIE, for example, and the first substrate layer 51 included in the substrate layer 50 is then partially removed by RIE (see FIG. 20). In this way, the base 110, the beams 120, and the cavity 101 are formed.

Figure 21:
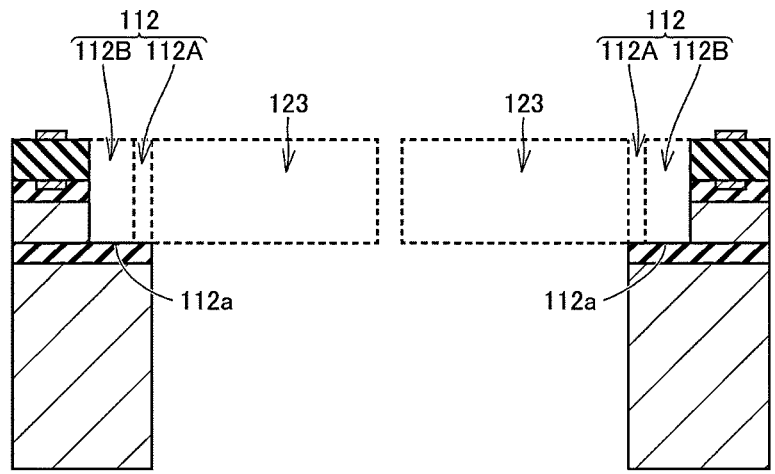
FIG. 21 is a sectional view of work in process under the non-limiting example of a method for manufacturing the transducer according to Preferred Embodiment 1 of the present invention, illustrating a state immediately before the provision of a coupling member.
Figure 22:
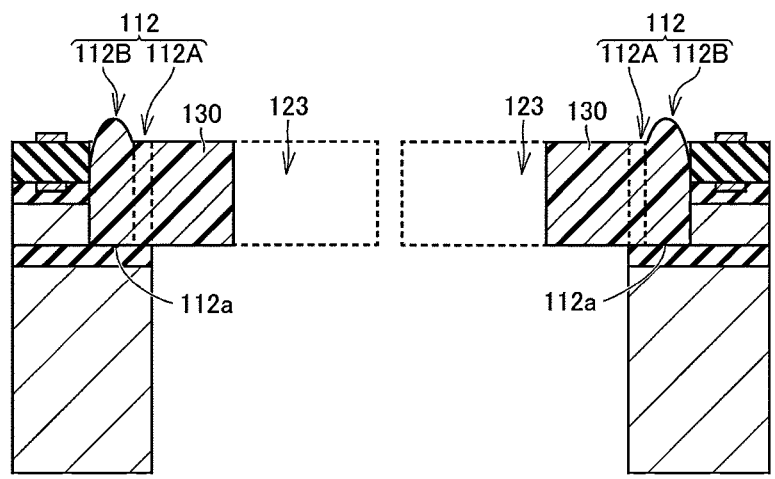
FIG. 22 is a sectional view of work in process under the non-limiting example of a method for manufacturing the transducer according to Preferred Embodiment 1 of the present invention, illustrating a state at a point in time after the application of the coupling member in liquid form.

Lastly, the coupling member 130 is provided, for example, in the following manner. FIG. 21 is a sectional view of work in process under the method for manufacturing the transducer according to Preferred Embodiment 1 of the present invention, illustrating a state immediately before providing a coupling member. FIG. 22 is a sectional view of work in process under the method for manufacturing the transducer according to Preferred Embodiment 1 of the present invention, illustrating a state at a point in time after the application of the coupling member in liquid form. FIGS. 21 and 22 are sectional views analogous to FIG. 5.

The coupling member 130 is formed in the following process. First, the coupling member 130 in liquid form is applied to the bottom surfaces 112a of the recesses 112 of the base 110 by using, for example, a dispensing method or a transfer method in such a manner that the recesses 112 are filled with the coupling member 130 (see FIGS. 21 and 22). In the present preferred embodiment, the coupling member 130 is applied to the bottom surfaces 112a of the outer recesses 112B of the base 110 such that the outer recesses 112B are filled with the coupling member 130.

With the recesses 112 being connected to the respective slits 123 and filled with the coupling member 130 in liquid form, the coupling member 130 in the recesses 112 spreads out into the slits 123 not by external force but by capillary action in the slits 123, which are relatively narrow (see FIG. 22). In the present preferred embodiment, the coupling member 130 in the outer recesses 112B of the base 110 spreads over the inner recesses 112A connected to the outer recesses 112B and then spreads out into the slits 123 connected to the respective inner recesses 112A, without the need for external force. In this way, the slits 123 are filled with the coupling member 130 in liquid form. Then, the coupling member 130 in liquid form solidifies in the slits.

This process is advantageous in that the coupling member 130 is provided in the slits 123 so as to eliminate or reduce the possibility that an undesired stagnant pool of liquid will be created. As a result, weight variation between the beams 120 is reduced such that the beams 120 can vibrate with a high degree of symmetry. Thus, the transducer 100 can exhibit improved device characteristics.

By undergoing these processes, the transducer 100 according to Preferred Embodiment 1 of the present invention takes the form illustrated in FIGS. 1 to 5.

In some preferred embodiments, the coupling member 130 is provided before the cavity 101 is formed. Before the cavity 101 is formed, the substrate layer 50 is located under the slits 123 in the direction of the central axis (see FIG. 18). In this state, the coupling member 130 will not fall out of the slits 123 located between adjacent ones of the beams 120 during the process of forming the coupling member 130 in the slits 123. For this reason, each slit 123 may be relatively wide in the direction orthogonal or substantially orthogonal to the direction of extension of the slit 123.

Figure 23:
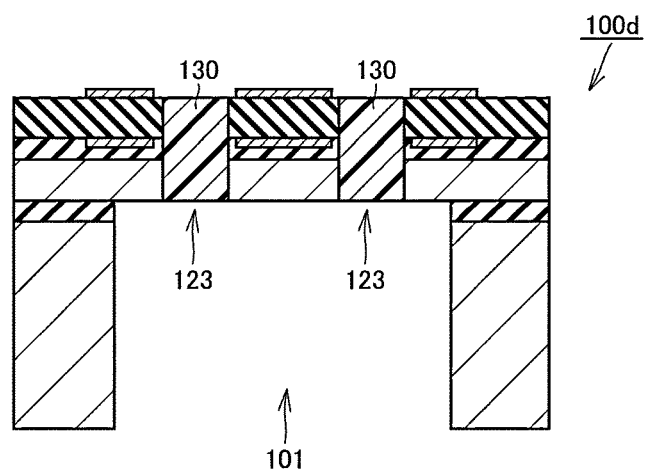
FIG. 23 is a sectional view of a transducer according to a fourth modification of Preferred Embodiment 1 of the present invention.

FIG. 23 is a sectional view of a transducer according to a fourth modification of Preferred Embodiment 1 of the present invention. FIG. 23 is a sectional view analogous to FIG. 3. Referring to FIG. 23, the transducer according to the fourth modification of Preferred Embodiment 1 of the present invention is denoted by 100d, and the slits 123 of the transducer 100d are wider than the slits 123 of the transducer 100 (see FIG. 3) according to Preferred Embodiment 1 of the present invention. As noted above, the coupling member 130 is less likely to fall out of the slits when being formed in a state in which the cavity 101 is yet to be formed. This holds true for the transducer 100d according to the fourth modification of Preferred Embodiment 1 of the present invention.

As described above, the transducer 100 according to Preferred Embodiment 1 of the present invention includes the base 110, the beams 120, and the coupling member 130. The base 110 is, for example, ring-shaped. The beams 120 each include the fixed end portion 121 and the tip portion 122. The fixed end portion 121 is connected to the inner periphery 111 of the base 110. The tip portion 122 is located opposite the fixed end portion 121. Each of the beams 120 extends such that the tip portion 122 is farther than the fixed end portion 121 from the inner periphery 111. The beams 120 each include the piezoelectric layer 10, the first electrode layer 20, and the second electrode layer 30. The first electrode layer 20 and the second electrode layer 30 are disposed on opposite sides of the piezoelectric layer 10 in the direction of the central axis of the base 110 such that the second electrode layer 30 faces at least a portion of the first electrode layer 20 with the piezoelectric layer 10 interposed therebetween. The coupling member 130 is fitted in the slits 123 between adjacent ones of the beams 120 to form a connection between the beams 120. The coupling member 130 extends from the upper portion of the base 110 into each of the slits 123 without a break. The Young's modulus of the material of the coupling member 130 is lower than the Young's modulus of the material of the piezoelectric layer 10. The maximum thickness of the coupling member 130 in the upper portion of the base 110 in the direction of the central axis of the base 110 is greater than the thickness of each of the beams 120.

Thus, the coupling member 130 in the slits 123 between adjacent ones of the beams 120 is stably fixed in place by friction between the upper portion of the base 110 and the coupling member 130, which is fitted in the upper portion of the base 110 and each of the slits 123 without a break and is relatively thick in the upper portion of the base 110. This feature eliminates or reduces the possibility that the coupling member 130 will fall out of the slits 123 due to vibration of the beams 120. Consequently, the occurrence of vibration in the coupled vibration mode in which at least one beam 120 vibrates out of phase with the other beams 120 is eliminated or reduced continuously and constantly by the coupling member 130, and as a result, the transducer 100 can exhibit improved device characteristics.

In a preferred embodiment of the present invention, the upper portion of the base 110 includes the recesses 112 that are connected to the respective slits 123. The coupling member 130 is fitted inside each of the recesses 112 and the corresponding one of the slits 123 without a break.

Thus, the coupling member 130 in the slits 123 between adjacent ones of the beams 120 is stably fixed in place by friction between the coupling member 130 and the inner surface of each recess 112. This feature eliminates or reduces the possibility that the coupling member 130 will fall out of the slits 123 due to vibration of the beams 120. Thus, the transducer 100 can exhibit improved device characteristics.

In a preferred embodiment of the present invention, the maximum thickness of the coupling member 130 on the bottom surface 112a of each of the recesses 112 defined by the side walls 114 is greater than the height of each of the side walls 114, where the maximum thickness of the coupling member 130 is the dimension in the direction of the central axis of the base 110.

Thus, the coupling member 130 in the slits 123 is more stably fixed in place by increased friction between the coupling member 130 in the recesses 112 and the inner surface of each recess 112. This feature enables the transducer 100 to exhibit further improved device characteristics.

In a preferred embodiment of the present invention, the maximum width of each of the recesses 112 viewed in the direction of the central axis of the base 110 is greater than the width of the corresponding one of the slits 123, where the maximum width of each of the recesses 112 is the dimension orthogonal or substantially orthogonal to the direction in which the corresponding one of the slits 123 extends.

The coupling member 130 on the base 110 in the preferred embodiment of the present invention is sufficiently greater in volume on the base 110 than in the slits 123. Thus, the coupling member 130 in the slits 123 is much more stably held in place by further increased friction between the coupling member 130 in the recesses 112 and the inner surface of each recess 112. This feature enables the transducer 100 to exhibit further improved device characteristics.

In a preferred embodiment of the present invention, the Young's modulus of the material of the coupling member 130 is lower than or equal to about 1 Gpa, for example. Setting the Young's modulus of the coupling member 130 to about 1 GPa or below eliminates or reduces the possibility that the beams 120 will be too firmly fixed to each other by the coupling member 130. Thus, the resonant frequency of each beam 120 can be easily controlled with a view to improving the device characteristics. The device characteristics of the transducer 100 are less susceptible to external stress (e.g., thermal stress) applied to the beams 120.

In a preferred embodiment of the present invention, the piezoelectric layer 10 is made of an inorganic material. The coupling member 130 is made of an organic material. Organic materials are mostly lower in Young's modulus than inorganic materials, and a wide selection of materials is thus available for the piezoelectric layer 10 and the coupling member 130. This provides ease in designing the transducer 100.

In a preferred embodiment of the present invention, the coupling member 130 is made of silicone resin or fluoroelastomer, for example. This feature provides ease of design. That is, it is easily ensure that the Young's modulus of the material of the coupling member 130 is lower than the Young's modulus of the material of the piezoelectric layer 10.

In a preferred embodiment of the present invention, the piezoelectric layer 10 is made of lithium niobate ($LiNbO_3$) or lithium tantalate ($LiTaO_3$), for example. Thus, the piezoelectricity of the piezoelectric layer 10 is improved such that the transducer 100 can exhibit improved device characteristics.

In a preferred embodiment of the present invention, the slits 123 each include a portion in which the coupling member 130 is not located. This feature eliminates or reduces the possibility that the pressure difference between the upper portion and the lower portion of each beam 120 will become greater due to vibration of the beams 120.

In a preferred embodiment of the present invention, the tip portions 122 of the beams 120 are not connected to each other by the coupling member 130 and are discretely located away from each other. That is, the coupling member 130 defines a connection between the beams 120 so as to facilitate the displacement of the tip portions 122. Thus, the transducer 100 can exhibit improved device characteristics. Furthermore, a vent hole can be formed though an abbreviated process to eliminate or reduce the possibility that the pressure difference between the upper portion and the lower portion of each beam 120 will become greater.

Preferred Embodiment 2

The following describes a transducer according to Preferred Embodiment 2 of the present invention. The transducer according to Preferred Embodiment 2 of the present invention differs from the transducer 100 according to Preferred Embodiment 1 of the present invention mainly in the following respects: the coupling member is fitted in the entirety or substantially the entirety of each slit, and the beams each include a through-hole. The transducer according to Preferred Embodiment 2 of the present invention is otherwise the same as or similar to the transducer 100 according to Preferred Embodiment 1 of the present invention, and redundant description thereof will be omitted.

Figure 24:
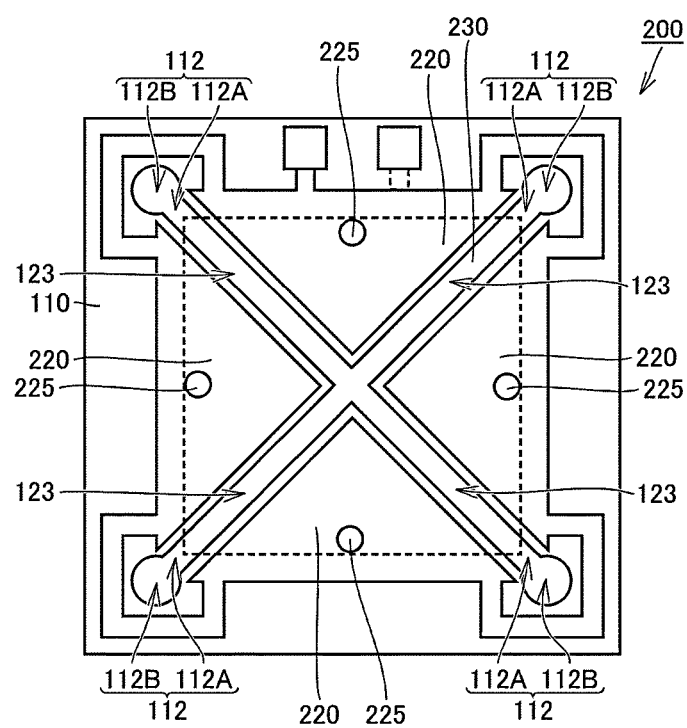
FIG. 24 is a plan view of a transducer according to Preferred Embodiment 2 of the present invention.

FIG. 24 is a plan view of the transducer according to Preferred Embodiment 2 of the present invention. Referring to FIG. 24, the transducer according to Preferred Embodiment 2 of the present invention is denoted by 200 and includes beams 220, and at least one of which has a through-hole 225. The through-hole 225 extends through the at least one of the beams 220 in the direction of the central axis of the base 110. The through-hole 225 is discretely located away from the slits 123. Due to the presence of the through-hole 225, the transducer 200 according to Preferred Embodiment 2 of the present invention eliminates or reduces the possibility that the pressure difference between the upper portion and the lower portion of each beam 220 in the direction of the central axis will become greater due to vibration of the beams 220. Thus, degradation of the device characteristics of the transducer 200 can be reduced or prevented.

More specifically, the beams 220 in Preferred Embodiment 2 of the present invention each include the through-hole 225 extending in the direction of the central axis of the base 110. The through-holes 225 of the beams 220 are arranged symmetrically or substantially symmetrically about the central axis when viewed in the direction of the central axis. The through-holes 225 arranged in this manner define and function as vent holes so as to increase the symmetry between the beams 220 viewed in the direction of the central axis. In this state, the beams 220 are more likely to vibrate in synchronization with each other. Thus, the transducer 200 can exhibit improve device characteristics.

The coupling member in the present preferred embodiment is denoted by 230 and is fitted in the entirety or substantially the entirety of each slit 123 when viewed in the direction of the central axis. That is, the present preferred embodiment eliminates the need for the central clearance. In the present preferred embodiment, there is no problem with the coupling member 230 fitted as described above. The reason for this is that the through-holes 225 defining and functioning as vent holes eliminate or reduce the possibility that the device characteristics of the transducer 200 will degrade. It is not required that the clearance be eliminated. As with the slits 123 of the transducer 100 according to Preferred Embodiment 1 of the present invention, the slits 123 in the present preferred embodiment each may include a portion in which the coupling member 230 is not located when viewed in the direction of the central axis.

The transducer 200 according to Preferred Embodiment 2 of the present invention includes the following features. The maximum thickness of the coupling member 230 in the upper portion of the base 110 in the direction of the central axis of the base 110 is greater than the thickness of each of the beams 220. The coupling member 230 is fitted inside each of the recesses 112 and the corresponding one of the slits 123 without a break. Thus, the coupling member 230 is stably fixed in place such that the transducer 200 can exhibit improved device characteristics.

The features of preferred embodiments of the present invention described above may be used in combination where practicable.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transducer, comprising:
   a base that is ring-shaped;
   beams each including a fixed end portion connected to an inner periphery of the base and a tip portion located opposite the fixed end portion, each of the beams extending such that the tip portion is farther than the fixed end portion from the inner periphery; and
   a coupler fitted in slits between adjacent ones of the beams to define a connection between the beams and extending from an upper portion of the base into each of the slits without a break; wherein
   the beams each include:
     a piezoelectric layer; and
     a first electrode layer and a second electrode layer on opposite sides of the piezoelectric layer in a direction of a central axis of the base such that the second electrode layer faces at least a portion of the first electrode layer with the piezoelectric layer interposed therebetween in the direction of the central axis;
   a Young's modulus of a material of the coupler is lower than a Young's modulus of a material of the piezoelectric layer; and
   a maximum thickness of the coupler in the upper portion of the base in the direction of the central axis of the base is greater than a thickness of each of the beams.

2. The transducer according to claim 1, wherein
   the upper portion of the base includes recesses connected to a respective one of the slits; and
   the coupler is fitted inside each of the recesses and the corresponding one of the slits without a break.

3. The transducer according to claim 2, wherein a maximum thickness of the coupler on a bottom surface of each of the recesses defined by side walls is greater than a height of each of the side walls, where the maximum thickness of the coupler on the bottom surface of each of the recesses defined by side walls is a dimension in the direction of the central axis of the base.

4. The transducer according to claim 2, wherein a maximum width of each of the recesses viewed in the direction of the central axis of the base is greater than a width of a corresponding one of the slits, where the maximum width of each of the recesses is a dimension orthogonal or substantially orthogonal to a direction in which the corresponding one of the slits extends.

5. The transducer according to claim 1, wherein the Young's modulus of the material of the coupler is less than or equal to about 1 GPa.

6. The transducer according to claim 1, wherein
   the piezoelectric layer is made of an inorganic material; and
   the coupler is made of an organic material.

7. The transducer according to claim 6, wherein the coupler is made of silicone resin or fluoroelastomer.

8. The transducer according to claim 6, wherein the piezoelectric layer is made of lithium niobate or lithium tantalate.

9. The transducer according to claim 1, wherein the slits each include a portion in which the coupler is not located.

10. The transducer according to claim 9, wherein the tip portions of the beams are not connected to each other by the coupler and are spaced away from each other.

11. The transducer according to claim 1, wherein
    at least one of the beams includes a through-hole extending through the at least one of the beams in the direction of the central axis of the base; and
    the through-hole is spaced away from the slits.

12. The transducer according to claim 11, wherein
    the tip portions of the beams point to the central axis of the base when viewed in the direction of the central axis;
    the beams each include a through-hole extending in the direction of the central axis; and
    the through-holes of the beams are symmetrical about the central axis when viewed in the direction of the central axis.

13. A transducer, comprising:
    a base that is ring-shaped;
    beams each including a fixed end portion connected to an inner periphery of the base and a tip portion located opposite the fixed end portion, each of the beams extending such that the tip portion is farther than the fixed end portion from the inner periphery; and
    a coupler fitted in slits between adjacent ones of the beams to define a connection between the beams and extending from an upper portion of the base into each of the slits without a break; wherein the beams each include:
- a piezoelectric layer; and
- a first electrode layer and a second electrode layer on opposite sides of the piezoelectric layer such that the second electrode layer faces at least a portion of the first electrode layer with the piezoelectric layer interposed therebetween;

a Young's modulus of a material of the coupler is lower than a Young's modulus of a material of the piezoelectric layer;

the upper portion of the base includes recesses connected to the respective slits; and the coupler is fitted inside each of the recesses and the corresponding one of the slits without a break.

14. The transducer according to claim 13, wherein a maximum thickness of the coupler on a bottom surface of each of the recesses defined by side walls is greater than a height of each of the side walls, where the maximum thickness of the coupler is a dimension in a direction of a central axis of the base.

15. The transducer according to claim 13, wherein a maximum width of each of the recesses viewed in the direction of the central axis of the base is greater than a width of a corresponding one of the slits, where the maximum width of each of the recesses is a dimension orthogonal or substantially orthogonal to a direction in which the corresponding one of the slits extends.

16. The transducer according to claim 13, wherein the Young's modulus of the material of the coupler is less than or equal to about 1 GPa.

17. The transducer according to claim 13, wherein
- the piezoelectric layer is made of an inorganic material; and
- the coupler is made of an organic material.

18. The transducer according to claim 17, wherein the coupler is made of silicone resin or fluoroelastomer.

19. The transducer according to claim 17, wherein the piezoelectric layer is made of lithium niobate or lithium tantalate.

20. The transducer according to claim 13, wherein the slits each include a portion in which the coupler is not located.

* * * * *